United States Patent [19]

Sandner

[11] 4,019,821
[45] Apr. 26, 1977

[54] APPARATUS FOR TONING TACKY SURFACES

[75] Inventor: Helmut Gustav Sandner, Oceanport, N.J.

[73] Assignee: E. I. Du Pont de Nemours and Company, Wilmington, Del.

[22] Filed: July 30, 1976

[21] Appl. No.: 710,102

Related U.S. Application Data

[62] Division of Ser. No. 605,541, Aug. 18, 1975.

[52] U.S. Cl. .................................. 401/4; 401/139; 401/22
[51] Int. Cl.² .......................................... B05C 11/02
[58] Field of Search ............ 427/180, 184; 15/210, 15/210.5; 401/22, 137, 4, 18, 23, 139, 200, 26, 27; 118/637, 264, 206, 207, 216

[56] References Cited
UNITED STATES PATENTS

| | | |
|---|---|---|
| 527,456 | 10/1894 | Roche .................................. 401/4 |
| 1,112,409 | 9/1914 | Nielsen ............................... 401/4 X |
| 1,508,541 | 9/1924 | Cross .................................. 401/4 X |
| 1,945,065 | 1/1934 | Mosslang et al. ................. 401/25 X |
| 3,112,513 | 12/1963 | Thornton ............................ 401/22 |
| 3,246,360 | 4/1966 | Yonkers ......................... 401/218 X |
| 3,289,240 | 12/1966 | Vanderveer et al. ............. 401/22 X |

*Primary Examiner*—Morris Kaplan

[57] ABSTRACT

A toner applicator comprising a housing for containment of toner, at least one free-moving weight within said housing for breaking up toner aggregates and agitating the toner, separable pad members forming a bottom wall of the housing and releasing said toner upon separation thereof, and said members being hingedly mounted whereby to adapt to distributing a mound of said released toner across an image area to be developed of a surface having imagewise tacky and nontacky areas.

6 Claims, 6 Drawing Figures

APPARATUS FOR TONING TACKY SURFACES

This is a division of application Ser. No. 605,541, filed Aug. 18, 1975.

BACKGROUND OF THE INVENTION
1. Field of the Invention

This invention relates to image reproduction systems and more particularly to image reproduction systems involving the application of toner particles over a tacky surface to develop a latent image.

2. Description of Prior Art

The advent of electrophotography and wide acceptance of the electrostatic reproduction method have resulted in a large number of processes and devices useful in the application of toner particles on an electrically charged surface. Mechanisms and associated methods such as cloud chambers cascade developers, transfer brushes, and rollers are well known. In general, some means are usually provided to meter the amount and/or rate of toner application.

In the graphic arts area, a system of image reproduction has been employed, whereby a photosensitive element is first exposed to actinic radiation in an imagewise exposure. The element exhibits a different degree of tackiness as a result of this exposure. The latent image can be developed through a process called toning, whereby toner particles are distributed over the surface of the element and adhered to the tacky areas. A typical such element and associated process, capable of producing multi-colored images is described in V. F. H. Chu et al, U.S. Pat. No. 3,649,268 and the patents referred to therein, while a description of a typical toning method is found in M. Burg et al, U.S. Pat. No. 3,060,024.

It has also been known in the art to use a small pad having a handle on one side and a thick pile, such as lambswool, on the other, to apply and distribute the toner over the latent image-bearing surface. The pad is dipped in a dish containing a supply of toner; it is then rubbed lightly and repeatedly in an S-type path over the latent image-bearing surface. Toner particles adhere to the tacky areas and the image is thus developed.

Another practice has been to first apply the toner by patting a pad dipped in toner all over the surface and then using it to rub the surface with an S-type motion as before. This practice is slow, untidy, and generates an objectionable dust cloud during the patting operation. Results generally lack reproducibility.

Rotating, or combinations of rotating and oscillating cylindrical brushes used to embed a toner in the soft areas of an imagewise exposed surface have also been tried in the prior art, and a good summary of the various alternatives will be found in R. W. Jones et al, U.S. Pat. No. 3,723,123.

Both electrostatic and tacky surface image development involve the application of toner particles over a latent image-bearing surface. In that respect there is a similarity in the problems encountered, especially the problems relating to the dispensing of toner particles. However, systems using the tacky surface principle, be it a situation where the toner particles simply adhere to the surface or are embedded therein, present an additional problem. The amount of toner adhered to the tacky surface tends to vary, depending on the delivery rate and method or distribution over the surface. This is particularly noticeable where the toning step is done manually, resulting in nonreproducible development. Additionally, the softer, tacky surface is vulnerable to scratching.

In an effort to eliminate these problems, the patting method and roller applicators have been introduced, but with questionable results. Problems still unsolved are uniformity of density over large, said color areas, dust clouds, reproducibility and ease of handling.

A need for a simple and reliable method to reproducibly distribute toner over a tacky surface still persists.

SUMMARY OF THE INVENTION

According to the invention there is provided an apparatus for the development of a surface, at least portions of which are tacky, comprising arranging toner particles in the form of an elongated mound on a section of said surface and then distributing said toner particles over said surface by pushing the elongated mound of toner particles across said surface with at least one pad with at least a portion of the mound beneath the pad (esp., the leading edge thereof), whereby the distributed toner particles become adhered to the tacky portions of said surface. The development is completed by wiping off excess toner from the surface. The surface is preferably an imagewise exposed photohardenable layer. In this case the toner becomes imagewise adhered to the surface.

In a preferred process, the pad is moved across the surface in a curvilinear path pushing the elongated mound of toner particles in front of it. The curvilinear path may be sinusoidal, serpentine, spiral, elliptical, figure eight, S, or other patterns.

There is further provided according to this invention an applicator apparatus for the development of an imagewise exposed element with a surface having imagewise tacky and nontacky areas comprising a housing for containment of toner, at least one free-moving weight within said housing for breaking up toner aggregates and agitating the toner, means to release toner from the housing, and at least two hinged pads mounted on the housing.

The apparatus may further comprise an additional cleaning pad, detachably mounted over the applicator pads to remove excess toner from the surface of the exposed element.

The described apparatus overcomes the problems of the prior art in a simple manner. By confining the deposition of the toner to a relatively small area of the total surface, the dust problem can be effectively controlled. What is more surprising is that the subsequent distribution by the applicator pad over the remaining surface results in a reproducible, generally streak-free, and uniform density image.

DESCRIPTION OF THE PREFERRED EMBODIMENT

In practicing the invention, a photohardenable element useful in an image reproduction process of the type disclosed in Chu et al, U.S. Pat. No. 3,649,268, may be selected. Such an element, which preferably comprises a photopolymerizable layer on a sheet support, following an imagewise exposure, will bear on its surface a latent image comprised of imagewise tacky and nontacky areas. Development of the image is obtained by distributing toner particles over the latent image-bearing surface. The toner particles tend to adhere on the tacky sections to render the latent image visible. The toner is comprised of particles, especially pigment particles, which may be colored to produce a color image. A uniformly tacky surface such as an unexposed photohardenable element or a board coated with partially dried shellac may also be toned according to the invention.

In the preferred embodiment of this invention, the photosensitive element is imagewise exposed to produce a latent image of tacky and nontacky areas on the surface of the element. It is then placed in a processing tray or simply a flat table top.

A quantity of toner particles in excess of that required to develop the image on the surface, or section thereof to be toned, is first deposited on the surface, preferably onto a conveniently located small area of the surface of the element being processed. By mode of depositing or pushing with a pad, the toner particles can be arranged in the form of a narrow, elongated mound. Such an area may be in the upper right hand corner, but of course any location on the surface or even outside the surface of the element is satisfactory, the choice being a matter of personal preference of the individual operator.

A detailed description of an apparatus particularly well adapted to the dispensing of toner particles is given later in this description. However, any hopper capable of delivering a quantity of toner particles to the form of an elongated, narrow mound within a relatively confined area, and without the release of significant dust in the environment is acceptable.

In the preferred apparatus, the toner is contained in a housing with movable pads on one side and containing a free-moving weight. To deposit the toner, the housing while lying on the proof is rapidly oscillated while holding the movable pads apart.

Figure 1:
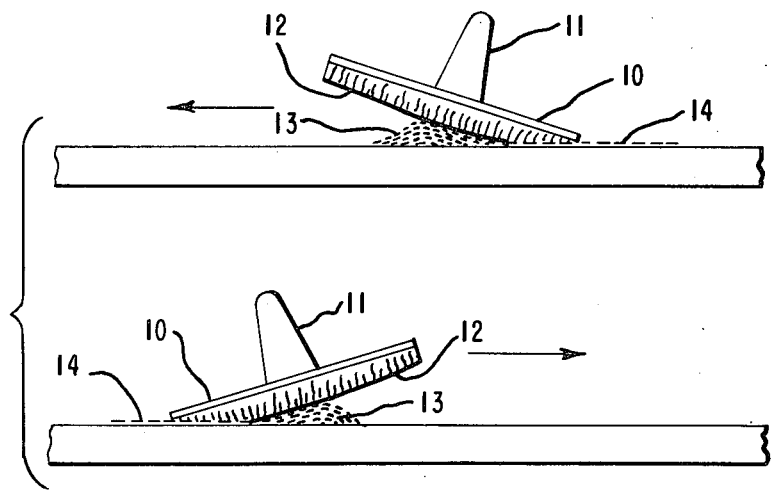
FIG. 1 shows a schematic of a pad and toner particles as the pad is moved over the imagewise exposed surface.

Once the toner has been deposited an arranged in the form of an elongated mound, it is distributed over the surface by pushing the mound along with a pad. A pad 10 may be used as shown in FIG. 1. The pad which preferably includes a handle 11 and a resilient underlayer 12 such as electrostatically flocked foam rubber, may be guided in a curvilinear path (especially, an S-type path) with a rocking motion over the exposed surface tracing a path which covers all of the surface. One complete coverage constitutes a cycle and more cycles than one may be used to obtain the desired color density and uniformity in the developed image. As described hereinafter, a pair of parallel pads is preferred.

For purposes of this invention, the rocking motion is defined as the lifting of one edge of the pad during the distribution of the toner while the pad is moved over the surface in one direction, and then the lowering of that edge and lifting of the other as the pad movement direction is reversed during the tracing of the S-type path over the exposed surface as shown in FIG. 1. This rocking motion results in maintaining the toner particles in a narrow mound 13 that extends all along the line of contact of the leading edge of the pad and the exposed surface of the processed element regardless of the relative direction of the pad over the surface. At least a portion of the mound is therefore beneath the part of the pad which is above and forward of the line of contact of the pad with the surface. As a consequence, the pad glides over a freshly adhered layer of toner 14, which has been withheld by the tacky areas from the mound of toner as it was pushed over the surface. This freshly adhered toner layer acts as a protective barrier between the pad surface and the sensitive tacky areas to prevent scratching of the tacky surface. In addition, since there is always an excess amount of toner in the moving mound, the tacky areas will constantly withhold the precise amount of toner needed to render them nontacky by saturation. Final density, therefore, tends to be reproducibly more uniform all across the toned areas.

The final step involves simply wiping off any excess toner lingering over exposed and unexposed areas of the surface of the element. A brush, lamb's wool pad, acrylic, deep pile fabric pad, cloth or even vacuum may be used to remove this nonadhered toner. the material selected will depend on matching the triboelectric properties of the pad, toner, and surface of the toned element. An acrylic pad is preferred, which is wiped over the surface in a series of long, uniform and continuous wiping moves from one end of the element to the other; the pad may be cleaned by passing it over a vacuum cleaner between wiping cycles.

Figure 2:
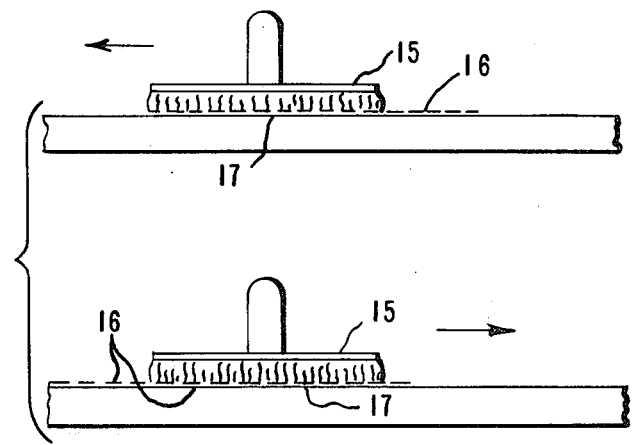
FIG. 2 shows a schematic of the typical prior art method of applying toner through a pad over an imagewise exposed surface.

FIG. 2 shows for comparative reasons the standard method of using a pad to distribute toner over the tacky surface. Toner particles are either sprinkled over the imagewise exposed surface or the pad itself may be first dipped into a container with toner; in either case during the distribution step of the development toner particles are randomly spread under the pad 15 which pushes the toner particles hard into and over the sensitive areas 16, of the tacky surface 17, resulting in nonreproducible development.

Figure 4:
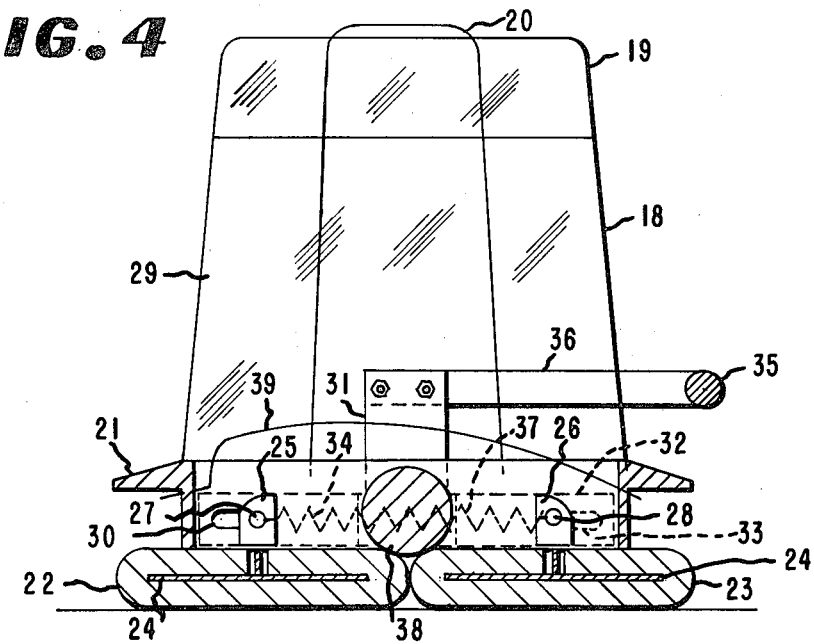
FIG. 4 shows an applicator device particularly well adapted for the manual performance of this process.

An applicator device adapted to practice this invention, comprising a housing for containment of toner particles, a free-moving roller within said housing for breaking up toner aggregates and agitating the toner (whereby it is positively dispensed), means to release toner from the housing, and at least two hinged pads mounted on the housing is shown in FIG. 4.

The device includes a housing 18, which is shaped somewhat like an inverted U-shaped trough, to provide an easy hand hold for the operator. The upper section of housing 18 is a removable cover 19 which is removably secured by a spring clip 20. On the lower end of the housing there is affixed a skirt 21 which tends to prevent the operator's fingers from inadvertently interfering with the operation of the applicator mechanism located below the skirt. In addition, this skirt tends to somewhat prevent loose flying toner particles from being released to the environment.

The lower part of the housing is open. The opening is, however, blocked by two applicator pads which in their normal position completely close the bottom of the housing and prevent any toner particles from escaping.

In the following description only one side of the applicator is shown. Identical complementary parts are also located on the opposite side and complete the mechanism.

The applicator pads 22 and 23 have an inner, rigid flat core 24 having a generally rectangular cross section, are covered on the outside with a resilient material and have a soft fabric or pile surface. Two tangs 25 and 26 are mounted perpendicular to the rigid core 24 and serve to rotatably attach pads 22 and 23 to the lower end of the housing. The attachment is accomplished through pins 27 and 28 respectively. Pins 27 and 28 extend beyond the full length of the pad and protrude outside the housing through openings in its sidewall 29. Pin 27 extends outside the hopper sidewall through slot 30 while pin 28 extends through the same wall 29 through a circular close fitting hole. This arrangement allows pad 22 to move laterally in addition to the rotary motion possible of both pads 22 and 23.

On the outside of side wall 29 of the housing there is mounted a bracket 31 shaped somewhat like an inverted T. The horizontal section 32 of bracket 31 bears a hole, and a slot shown by numeral 33 in FIG. 4. Pin 27 is inserted through the hole while pin 28 fits through slot 33. A helical tension spring 34 is strung between pins 27 and 28, on the outside of horizontal section 32 of bracket 31, pressing the pins against the inner side of the bracket holes, set at such a distance as to maintain the two pads 22 and 23 in contact with each other.

A manually depressible handle bar 35 on the side of the housing is attached to bracket 31 by an arm 36. Bracket 31 is brought above the skirt 21 through a slot 37 in that skirt on the side adjacent side wall 29. This arrangement permits the lateral motion of bracket 31 when handle bar 35 is pushed in the direction of the hopper. Since pad 22 is attached to bracket 31 through pin 27, it follows the movement of the handle bar. Spring 34 tends to restore pad 22 to its original position when handle bar 35 is released. This arrangement provides means for releasing toner from the housing.

Inside the housing and resting on pads 22 and 23 is a heavy roller 38 which extends almost the full length of the housing. As the pad is moved laterally, first in one direction then in the other, inertia tends to move roller 38 in a path limited by pins 27 and 28. Such path brings the roller successively over pad 22 and 23 passing over the point of contact between them. When handle bar 35 is pushed toward the housing, pad 22 has been moved laterally away from pad 23 creating an opening in the form of a slot extending the full length of the housing. The passage of roller 38 over this slot forces toner particles through the slot onto the surface below.

Two wire restrainers 39 are strung across the width of the housing to prevent the roller 38 from falling back and possibly forcing the housing cover 19 open, when the applicator pad is turned upside down or laid on its side.

In the preferred ebodiment, a transparent, plastic material is used for the housing, and cover 19 of the applicator device. Stainless steel is used for bracket 31, handle bar 35, roller 38 and other metal parts of the device. An electrostatically flocked foam rubber was chosen as the covering of pads 22 and 23. The materials described are exemplary only and individual items may be replaced by others having more desirable characteristics from the engineering or economic point of view.

Figure 6:
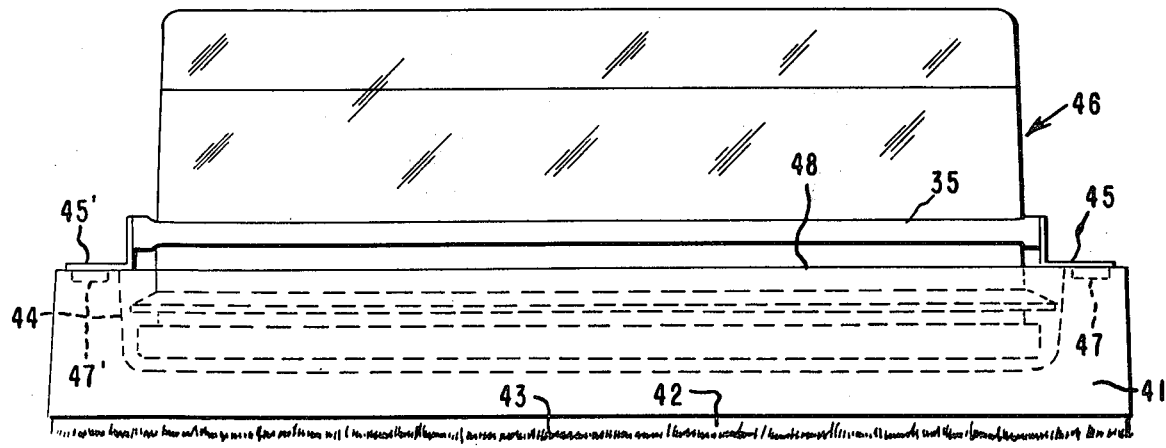
FIG. 6 is a schematic representation of the combined demountable cleaning pad and applicator device of FIG. 4.

The device described above may further include a provision of detachably mounting thereon an additional pad 41 with upper recess as shown in FIG. 6 which encloses the lower portion of the device on all four sides. Such pad may simply comprise a rectangular rigid block which bears on its lower surface 42 an acrylic pile 43. On the opposite side there may be provided a cavity 44 of sufficient size to contain the lower part, including skirt 21 of the toner applicator shown in FIG. 4. In this case a mating means must be provided both on pad 41 and the toner applicator. Such means may comprise two small metallic tabs 45 and 45' affixed on the sidewalls of the toner applicator 46. Two small magnets 47 and 47' embedded in the body of pad 41, adjacent surface 48 provide sufficient holding power when the metal tabs 45 and 45' are brought in close proximity to demountably attach pad 41 to applicator 46. This arrangement has the advantage of providing a clean and protected storage facility for the applicator pads 22 and 23 of the device, which are normally saturated with toner and present a staining hazard if left unprotected.

Pad 41 is used for the cleaning cycle which completes the processing of the imagewise exposed element.

Figure 3:
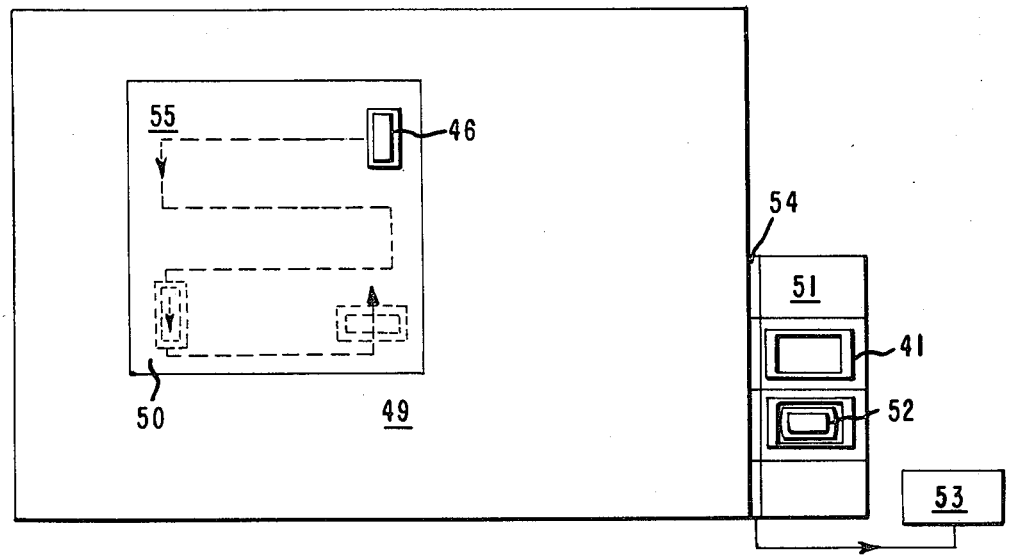
FIG. 3 is a schematic representation of a typical arrangement for the processing of an imagewise exposed element in accordance with this invention.

In operation, following exposure to actinic radiation, the element is placed on a flat surface for processing. A typical processing area is shown in FIG. 3 and may comprise a flat tray 49 on which is mounted the exposed element 50. The tray may provide a number of storage bins 51 on one side where toner applicator devices containing toners of various colors may be stored. As shown in FIG. 3, once the toner applicator 46 is removed from the cleaning pad 41, the pad 41 may be left in the storage bin. A complete assembly of applicator and cleaning pad is shown by numeral 52. Near the exit of each bin, there may be located a slot 54 which is connected to a vacuum cleaning system 53. Thus the lower part of the cleaning pad may be drawn over the slot both when inserted and removed from the storage bin as well as between cleaning strokes to remove any adhering toner particles.

Toner applicator 46 is preferably placed on the upper right hand corner of the exposed element 50 and in contact with the surface. It is then shaken vigorously back and forth while the operator depresses handle bar 35. This action both opens a slot at the bottom of the housing and forces roller 38 to move back and forth within the housing, breaking up toner caking and pushing toner particles onto the surface below. Because of the two pads present, the amount of toner released is limited to the volume defined by the two pads, the housing, and the surface of the element, and tends to be confined into an elongated mound under the slot. Once an excess amount of toner has been released, determined primarily by the number of back and forth vibrations imparted to the applicator, handle bar 35 is released and the actual processing of the element begins. The rocking motion of the pads maintains the mound of toner in a slightly compact condition.

Figure 5:
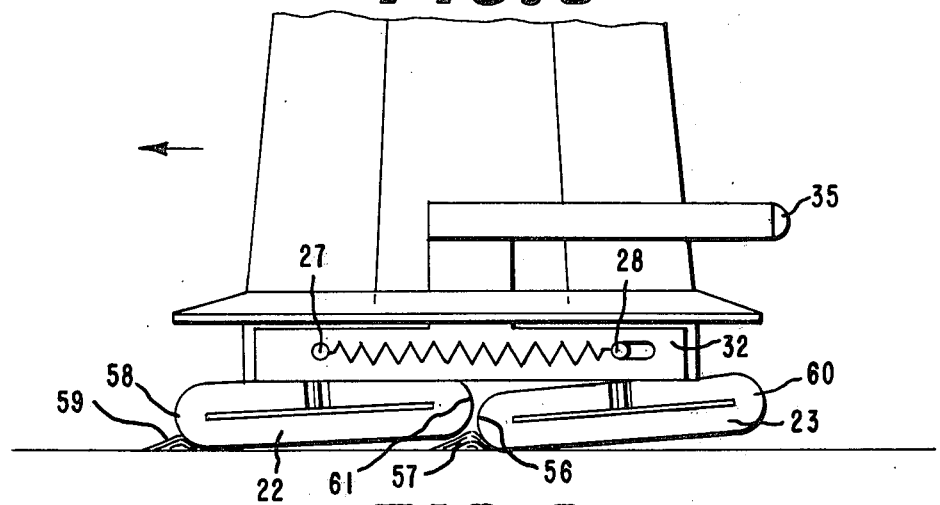
FIG. 5 is a schematic representation of the applicator device shown in FIG. 4 in operation.

The two pads, 22 and 23, below the housing are hinged on pins 27 and 28 and thus tend to swing around the axis of pin 27 and pin 28 as the applicator is moved over the surface of the exposed element. The extent of the swing is limited by the lower end of the housing as shown in FIG. 5. When the applicator is moved in the direction of the arrow in FIG. 5, leading edge 56 of pad 23 pushes the toner mound 57 over the exposed surface, while leading edge 58 of pad 22 forms and pushes a second smaller mound of toner 59. Due to the curvature of the pads, an acute angle (e.g., 3°–45°) is formed between the leading edges of the pads and the surface wherein at least a portion of the mounts 57 and 59 is contained in a slightly compact condition in front of the line of pad-to-surface contact and beneath the leading edge of each pad. The mound of toner 59 is created by toner particles carried by the pads and toner which escaped in the vicinity of the applicator during the toner releasing operation. It should also be noted that both pads have their lower surface completely covered with toner, as a consequence of the toner releasing operation, thus serving as a source of material for the creation of the smaller mound ahead of the leading pad.

As the applicator is guided laterally over the processed surface, it pushes a long narrow mound of toner just ahead of the point of contact between the pad and the sensitive surface. Since no pressure is applied over toner mounds 57 and 59, the tacky surface underneath will withhold always the same amount of toner as the mound moves over it. This amount will be precisely what is needed to render it nontacky, thus resulting in toner conservation through minimized waste.

When the applicator reaches point 55 in FIG. 3, the device is slideably moved in the direction of the arrow along the dotted path and the process is reversed. Since the pads 22 and 23 are symmetrical, previously lagging edge 60 becomes the new leading edge, pushing the smaller mound of toner while the now leading edge 61 pushes the larger mound. Thus, as the pad describes an S-type path over the exposed element, there is always a mound of toner preceding the point of contact between the pads and the sensitive surface.

As shown by the dotted line in FIG. 3, more than one complete cycle may be required to obtain the final degree of density uniformity desired. In addition, there may be need to release more toner, if the original quantity proves low. However, this is not critical and may be performed any number of times without adverse effect.

Once the desired degree of uniformity and density has been obtained, applicator 46 is attached to cleaning pad 41 which is preferably drawn over the vacuum slot 54 to remove any lingering dirt or toner. Then the pad is used to wipe off excess toner from the surface of element 50. In order to avoid staining the reverse side of element 50 it is preferred that excess toner be first removed from around the edges of this element, the center being left to the end. Experience has shown that even though an excess amount of toner is initially dispensed, total toner consumption is less than what is used when the sprinkling or patting methods are used, because the toner is adhered only to the tacky surfaces and almost none wasted over the nontacky areas.

The method of this invention is not limited by the embodiments described above. In an alternate approach a V-shaped resilient applicator may be employed, having an integral or even separate toner releasing mechanism and riding over guides attached to the processing area. Such applicator and guide combination could be used to push the toner across the sensitive surface of an exposed element and then lift the pad at the end of the travel and lower it behind the toner mound; so that, upon reversing the direction in which the pad travels, the toner mound will again be ahead of the point of contact between the sensitive surface and the applicator.

The element described in Chu et al, U.S. Pat. No. 3,649,268 is an imaging element known as positive working. What is meant by this term is that upon exposure, the areas that do not receive any actinic radiation become tacky, so that toner adheres to the nonexposed areas. However, this toner application method and associated equipment is equally useful for the development of negative working systems, i.e., systems in which the toner receptive areas are those which have been subjected to actinic radiation, such as described in pending application No. 583,456, by Cohen et al.

Control Test

A photopolymerizable element similar to that of Example I, U.S. Pat. No. 3,649,268 was prepared having 0.0003 inch (~0.0076 cm.) photopolymer layer coated on 0.005 inch (~0.0013 cm.) polyethylene terephthalate support, with the other side of the photopolymer layer covered with a 0.00075 inch (~0.0019 cm.) polypropylene film as a cover sheet. As in Example I, U.S. Pat. No. 3,649,268, the cover sheet was removed, the photopolymer layer laminated to Kromekote, (cast coated on side) cover paper, and exposed to actinic radiation.

A pattern comprising among other images, fourteen solid square test areas, about two by two inches (~5 × 5 cm.) evenly dispersed over a 17 by 24 inch (43.2 × 61 cm.) test sample was used to compare the reproducibility and uniformity resulting through the use of the method and apparatus of this invention against that of the prior art.

Twelve samples were prepared using the above target. Each sample was given the same exposure. Various operators were used in processing six of the samples, using the technique common in the prior art. This involves first placing the exposed element on a flat surface, preferably a processing tray, and using a pad with an acrylic pile of the type shown in FIG. 2. The pad was dipped in a tray containing a powdered cyan toner. It was then placed over the surface of the exposed element, and starting from the top right hand corner, guided over the surface of the element in an S-type path. This path constituted one full cycle. Starting from the end point of the first cycle, a second cycle was completed in a path at right angle to the first. The process continued until 20 cycles were performed. Following this, the surface of the element was cleaned using a piece of antistatic treated flannel cloth.

A conventional reflection densitometer was used to measure the resulting densities in each of the fourteen squares, and the average and mean deviation was computed for each sample. The following Table I summarizes the results.

Table I

| Operator | Average Density | Mean Deviation |
|---|---|---|
| A | 1.55 | 0.02 |
| A | 1.61 | 0.04 |
| B | 1.74 | 0.02 |
| B | 1.71 | 0.03 |
| C | 1.68 | 0.03 |
| C | 1.66 | 0.02 |

If one takes the average of the mean deviation of the density to be a measure of the uniformity obtained by an operator in an average processing, one gets a quantitative figure for comparison. Here this measure equals 0.027 density units. Also, a measure of reproducibility of this uniformity as operators and samples vary can be computed by taking the average of the average density of each sample and computing the mean deviation, which in this case results in 0.053 units.

EXAMPLE I

The same material, test target and measurements were repeated as for control test I above. Processing was done using a device substantially similar to the device shown in FIGS. 4, 5 and 6. It was found that 8 cycles rather than 20 were required to obtain the desired density. Results are summarized in Table II.

Table II

| Operator | Average Density (Density Units) | Mean Deviation (Density Units) |
|---|---|---|
| A | 1.51 | 0.02 |
| A | 1.52 | 0.04 |
| B | 1.53 | 0.03 |
| C | 1.51 | 0.02 |
| C | 1.53 | 0.02 |
| C | 1.52 | 0.02 |

Similarly, taking the average of the mean deviation as a measure of uniformity of density regardless of operator, we find that the measure for uniformity equals 0.025 density units while a computation of the mean deviation of the average density from operator to operator which is a measure of the reproducibility of the processing, equals 0.007 density units.

What is claimed is:

1. A toner applicator apparatus comprising a housing for containment of toner, at least one free moving weight within said housing for breaking up toner aggregates and agitating the toner, a pair of separable applicator pad members forming the bottom wall of said housing, means to impart-translation to said members to open and close said housing thereby releasing said toner onto a substrate to be developed, said pads being hingedly mounted to facillitate application of a mound of said released toner to the image areas of said substrate upon functional movement of said apparatus over said substrate, and at least two hinged pads mounted on the housing.

2. A toner applicator according to claim 1 wherein said free moving weight is a bar or roller.

3. A toner applicator according to claim 2 wherein said means for moving said pads apart from each other comprised a manually operable bar on the side of the housing.

4. A toner applicator according to claim 3 wherein said pads have a soft fabric or pile surface.

5. A toner applicator according to claim 4 detachably mounted on top of a pad which encloses the lower portion of said applicator.

6. A toner applicator according to claim 3 wherein said pads have an electrostatically flocked foam rubber surface.

* * * * *

UNITED STATES PATENT OFFICE
CERTIFICATE OF CORRECTION

PATENT NO. : 4,019,821
DATED : April 26, 1977
INVENTOR(S) : Helmut Gustav Sandner It is certified that error appears in the above—identified patent and that said Letters Patent are hereby corrected as shown below:

| Patent Column | Line | Corrections |
|---|---|---|
| 4 | 30 | After "toner", "the" should be -- The --. |
| 5 | 61 | "ebodiment" should be -- embodiment --. |
| 6 | 4 | "of" should be -- for --. |
| 10 | 15-16 | after "substrate" delete ", and at least two hinged pads mounted on the housing". |

Signed and Sealed this twenty-third Day of August 1977

[SEAL]

Attest:

RUTH C. MASON
Attesting Officer

C. MARSHALL DANN
Commissioner of Patents and Trademarks